United States Patent [19]
Barrett et al.

[11] Patent Number: 5,788,768
[45] Date of Patent: Aug. 4, 1998

[54] FEEDSTOCK ARRANGEMENT FOR SILICON CARBIDE BOULE GROWTH

[75] Inventors: Donovan L. Barrett, Port Orange, Fla.; Richard H. Hopkins, Export, Pa.

[73] Assignee: Northrop Grumman Corporation, Los Angeles, Calif.

[21] Appl. No.: 852,974

[22] Filed: May 8, 1997

[51] Int. Cl.$^6$ ................................................ C30B 35/00
[52] U.S. Cl. .................................. 117/200; 117/4; 117/84
[58] Field of Search ................................. 117/4, 84, 99, 117/200, 902, 930, 935; 252/62.3

[56] References Cited

U.S. PATENT DOCUMENTS

| | | |
|---|---|---|
| 4,866,005 | 9/1989 | Davis et al. ................................. 438/1 |
| 4,869,776 | 9/1989 | Kitagawa et al. ......................... 117/99 |
| 5,683,507 | 11/1997 | Barrett et al. ............................. 117/200 |

FOREIGN PATENT DOCUMENTS 406001699A  1/1994  Japan.

OTHER PUBLICATIONS

"Meeting device needs through melt growth of semiconductors;" R.N. Thomas, et al; *Journal of Crystal Growth* 99 (1990), pp. 643–653.

*Primary Examiner*—Felisa Garrett
*Attorney, Agent, or Firm*—Walter G. Sutcliff

[57] ABSTRACT

A silicon carbide feedstock charge for growing silicon carbide boules in a physical vapor transport system. The feedstock charge includes silicon carbide particles, as well as any dopant material, if required, in a structure which is rigid and self supportable. An elongated feedstock charge may be moved toward the seed crystal as the feedstock is depleted during boule growth. The feedstock charge may be tailored to provide a non-uniform flux for growing more planar boule faces.

8 Claims, 4 Drawing Sheets

FEEDSTOCK ARRANGEMENT FOR SILICON CARBIDE BOULE GROWTH

BACKGROUND OF THE INVENTION

1. Field of the Invention

The invention in general relates to the growing of single crystal silicon carbide boules and more particularly to an improved feedstock therefore.

2. Description of Related Art

Silicon carbide is being used extensively as a semiconductor material for various electronic applications. Semiconductor devices of silicon carbide have the ability to operate at higher voltages and temperatures than conventional silicon or gallium arsenide devices thus providing for higher power devices with reduced cooling requirements. Electronic applications for silicon carbide semiconductor devices include compact, low cost airborne, ship and ground radars, aircraft engine and flight controls, electric tank and ship propulsion systems and satellite communications, to name a few. In the commercial sector, silicon carbide may be used in the field of high definition television, industrial power conditioning, nuclear control and instrumentation and electric vehicle power trains.

Silicon carbide crystals may be grown in a variety of ways, one of which utilizes a seed crystal of silicon carbide positioned within a furnace system which also includes a source, or feedstock, in the form of a pure silicon carbide powder. The feedstock is heated to a temperature whereby the silicon carbide sublimates and is deposited upon the seed crystal. In one process, known as physical vapor transport, the seed crystal is positioned within a container having a growth cavity for the crystal. As silicon carbide is deposited from the feedstock, a silicon carbide crystal, called a boule, is grown within the container. After the boule is grown to the desired size, the container is removed from the furnace system for separation of the grown crystal which may then be prepared and sliced into wafers for use as semiconductor device substrates.

During the growth process, the feedstock becomes depleted and the apparatus must be partially disassembled in order to replenish the silicon carbide powder. This time consuming procedure is repeated until the desired silicon carbide crystal boule length is achieved. The present invention obviates this time consuming operation.

In addition, the invention allows for a more planar growth surface of the boule so that a boule may be grown with a lower concentration of crystalline defects.

SUMMARY OF THE INVENTION

An improved feedstock arrangement for silicon carbide single crystal boule growth is provided for use in a physical vapor transport system wherein the feedstock is separated from a silicon carbide seed crystal in a growth furnace system. A feedstock charge is utilized which is comprised of silicon carbide particles, as well as a dopant material, if desired. The feedstock charge is constructed and arranged to be rigid and self supportable. To provide for a more planar boule face during growth, the feedstock charge may be fabricated as concentric sections with each section being comprised of a particle size different from the particle size of the other section or sections of the charge.

DESCRIPTION OF THE PREFERRED EMBODIMENT

Figure 1:
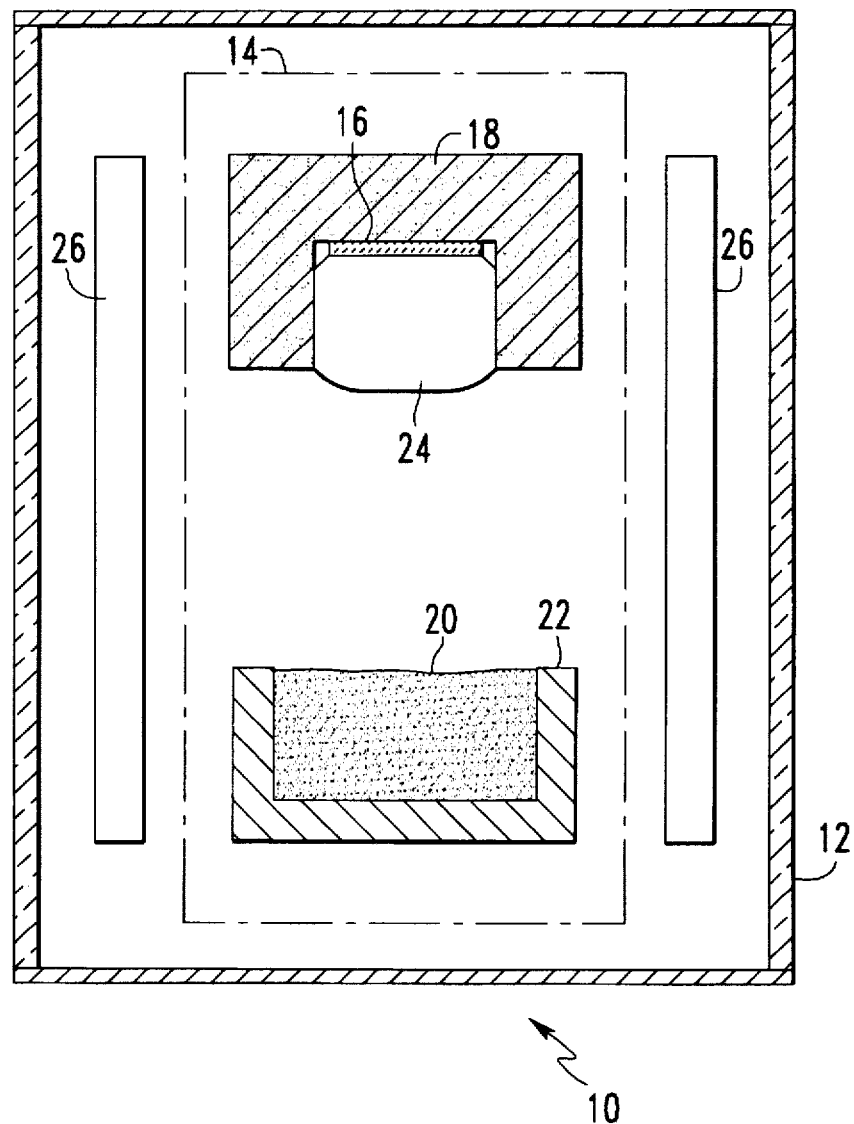
FIG. 1 shows, in rudimentary form, typical apparatus for growing silicon carbide boules by the physical transport process.

FIG. 1 shows, in rudimentary form, typical apparatus for growing silicon carbide boules by the aforementioned physical vapor transport method. The apparatus includes a furnace system 10 having a vacuum tight outer wall or cylinder 12, inside of which is a growth containment arrangement 14. A silicon carbide seed crystal 16 within seed container 18 is disposed at a certain distance from silicon carbide feedstock 20 within feedstock container 22. The required temperature for growth of the silicon carbide boule 24 is provided by a heating system 26, which may be inside or outside of the cylinder 12.

To grow the silicon carbide boule 24, the silicon carbide seed crystal 16 and silicon carbide feedstock 20 are placed in position and the furnace system is brought down to a near vacuum pressure of, for example, $10^{-7}$ Torr. The heater system is then activated to drive off any adsorbed gases in order to reduce any electrically active impurities which may be present. The interior pressure is then increased to near atmospheric pressure and then reduced to operating pressure where the growth temperature is established.

During the growth process the feedstock 20 becomes depleted to a point where it must be recharged. The apparatus is shut down, opened, and the feedstock charge is reloaded, after which temperature and pressure conditions are reestablished. This time consuming operation is repeated until the desired boule length is achieved.

The present invention allows for boule growth to extended lengths without the requirement for repetitive disassembly and feedstock recharging. This is accomplished with an improved feedstock arrangement in which the feedstock charge is a rigid and self supportable structure which may be fabricated by a number of different processes, one of which is illustrated in FIGS. 2A to 2D.

Figure 2A:
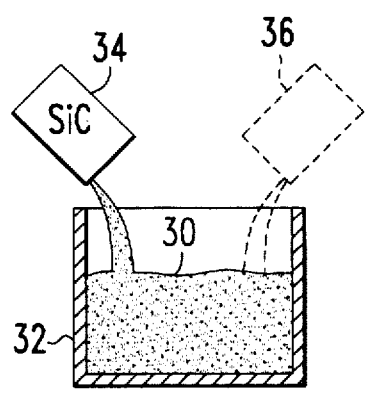
FIGS. 2A to 2D illustrate one method of making the improved feedstock charge in accordance with the present invention.
Figure 2B:
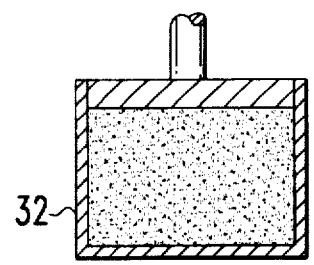
Figure 2C:
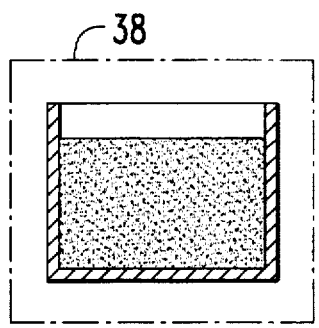
Figure 2D:
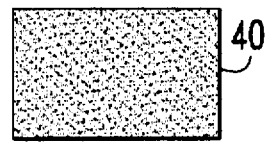

In FIG. 2A particles of pure silicon carbide 30 are placed into a container 32 from a silicon carbide source 34. If desired, and as indicated by the dotted block 36, an appropriate dopant material may also be added at this time. The particles in container 32 may be compacted to a desired density, as in FIG. 2B, and provided to a sintering oven 38, illustrated in FIG. 2C. The sintering operation is carried out at a temperature less than the melting point of the silicon carbide, resulting in a rigid self supportable silicon carbide charge 40 as depicted in FIG. 2D, where the charge is shown removed from its container 32.

Figure 3:
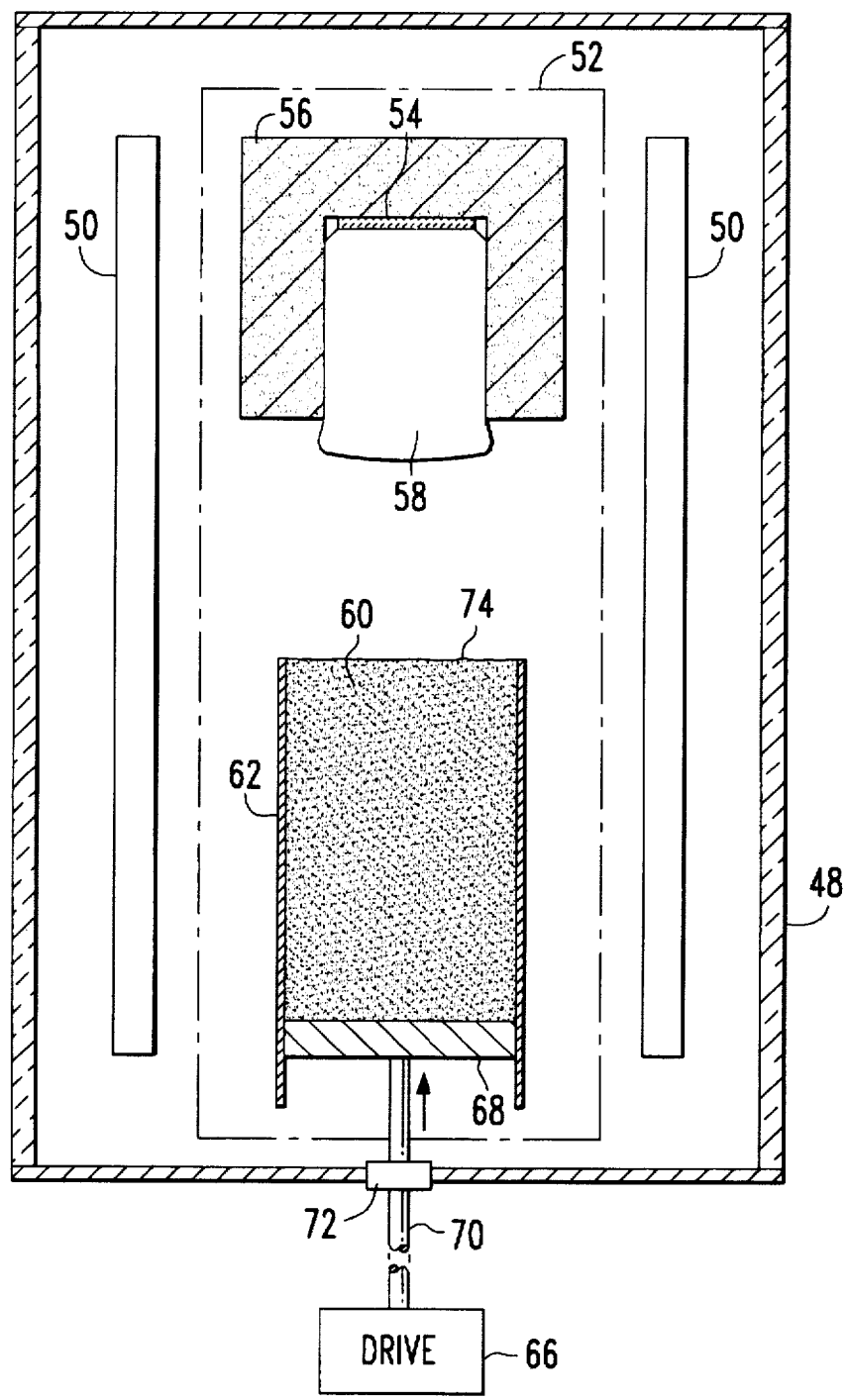
FIG. 3 is similar to FIG. 1 but modified to take advantage of the present invention.

The rigid silicon carbide charge may be made with a predetermined length which will eliminate recharging during the boule growing process. This may be accomplished by the apparatus illustrated in FIG. 3. The apparatus is somewhat similar to that of FIG. 1 in the inclusion of an outer vacuum tight wall 48, within which is located a heating system 50, a growth containment arrangement 52, a silicon carbide seed crystal 54 within a seed container 56 for growing a silicon carbide boule 58.

An improved feedstock arrangement includes a rigid silicon carbide charge 60 such as made by the process illustrated in FIGS. 2A to 2D, and being of a length to supply all of the silicon carbide necessary for growth of a boule 58 to a desired size. The silicon carbide charge 60 is positioned within an open sleeve or guide 62 and means are provided for moving the charge 60 relative to the boule 58 during the growth process. The means for moving, in one embodiment, includes a drive mechanism 66 operable to move a piston 68 via rod 70, which passes through a vacuum seal 72 in outer wall 48.

Silicon carbide charge 60 is freely slideable within guide 62 and drive mechanism 66 is operable to cause the exposed face 74 of the charge 60 to move toward boule 58 as the charge 60 is depleted. The length of charge 60 is selected such that replenishment is unnecessary and the entire boule growth can be accomplished without the requirement for repetitive disassembly of the apparatus.

Figure 4:
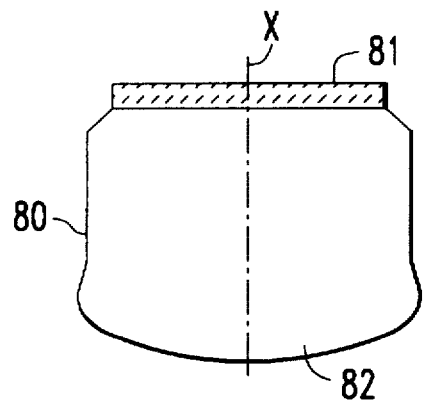
FIG. 4 is a view of a typical silicon carbide grown boule.

In boule growth it is known that a more nearly planar growth surface will produce a crystal with a lower concentration of crystalline defects such as dislocations, micropipes and small angle boundaries. With the present invention a silicon carbide feedstock may be tailored to provide a predetermined flux pattern across its face to compensate for uneven boule growth. For example, FIG. 4 illustrates a typical boule 80, grown from seed 82 and extending along an axis X. Due to a non-uniform axial heat distribution across the growing boule, the boule grows with a curved face as depicted at 84.

Figure 5:
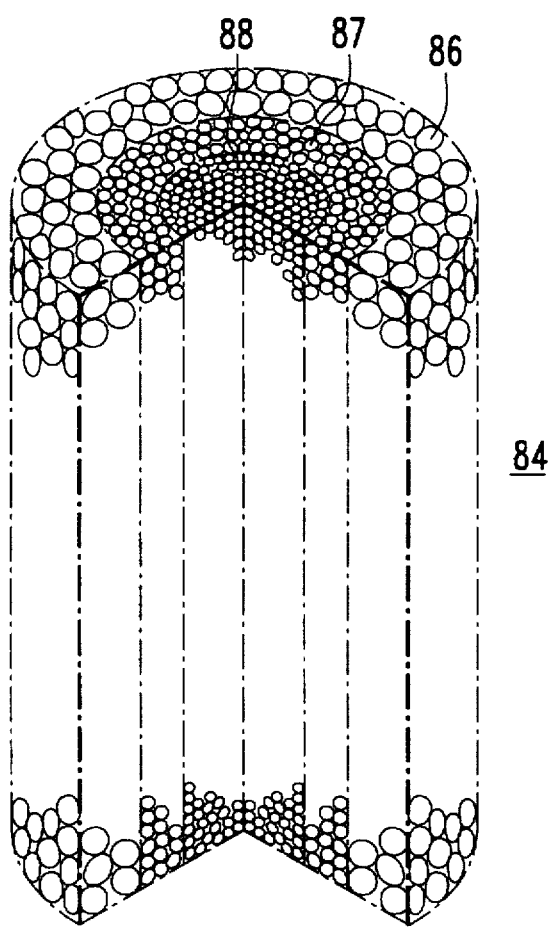
FIG. 5 is a cutaway view of a feedstock charge which may be fabricated for improved boule growth.
Figure 6:
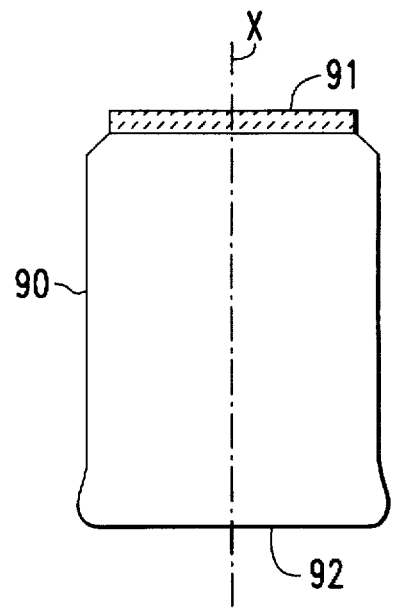
FIG. 6 is a view of an improved boule grown using a feedstock such as illustrated in FIG. 5.

In order to compensate for this non-uniform heat distribution, a silicon carbide charge such as illustrated in FIG. 5 may be fabricated to provide a compensating non-uniform flux distribution, where the flux is a function of the surface-to-volume ratio of the particles constituting the feedstock. The silicon carbide charge 84 is a rigid self supportable charge comprised of a plurality of sections, three being illustrated by way of example. Outer section 86 is comprised of relatively large sized silicon carbide particles, middle section 87 is comprised of relatively smaller particles and inner section 88 has the smallest particles of the three sections. With the different surface-to-volume ratios of the different sections, a boules such as illustrated in FIG. 6 may be grown. It is seen that the boule 90, grown from seed 91, has a more planar face 92 and accordingly, reduced crystalline defects compared with the boule of FIG. 4.

What is claimed is:

1. A feedstock arrangement for silicon carbide single crystal boule growth in a physical vapor transport system wherein the feedstock is separated from a silicon carbide seed crystal in a growth furnace system, comprising:

(a) a feedstock charge comprised of at least silicon carbide particles;

(b) said feedstock charge being rigid and self supportable.

2. A feedstock arrangement according to claim 1 wherein:

(a) said feedstock charge is a sintered mass.

3. A feedstock arrangement according to claim 1 wherein:

(a) said feedstock charge includes a predetermined dopant.

4. A feedstock arrangement according to claim 1 wherein:

(a) said feedstock charge is comprised of a plurality of concentric sections;

(b) each of said sections having a uniform silicon carbide particle size distribution therein;

(c) each of said sections having a silicon carbide particle size different from that of the other of said sections.

5. A feedstock arrangement according to claim 1 which additionally includes:

(a) means for moving said feedstock charge relative to said seed crystal.

6. A feedstock arrangement according to claim 5 wherein:

(a) means are provided for moving said feedstock charge.

7. A feedstock arrangement according to claim 6 which includes:

(a) a guide in which said feedstock charge is moveable;

(b) a drive mechanism;

(c) means connecting said drive mechanism with said feedstock charge for moving it toward said seed crystal as said feedstock charge is depleted during crystal growth.

8. A feedstock arrangement according to claim 7 wherein:

(a) said drive mechanism is outside of said growth furnace system.

* * * * *